United States Patent
Detry

(10) Patent No.: US 8,293,657 B2
(45) Date of Patent: Oct. 23, 2012

(54) SACRIFICIAL LAYERS MADE FROM AEROGEL FOR MICROELECTROMECHANICAL SYSTEMS (MEMS) DEVICE FABRICATION PROCESSES

(75) Inventor: James F. Detry, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 61 days.

(21) Appl. No.: 12/940,348

(22) Filed: Nov. 5, 2010

(65) Prior Publication Data
US 2012/0115269 A1    May 10, 2012

(51) Int. Cl.
*H01L 21/302*    (2006.01)
*H01L 21/461*    (2006.01)

(52) U.S. Cl. ............................ 438/745; 438/778; 438/52

(58) Field of Classification Search .................. None
See application file for complete search history.

(56) References Cited

U.S. PATENT DOCUMENTS

| | | | |
|---|---|---|---|
| 5,409,683 A | 4/1995 | Tillotson et al. | |
| 5,658,832 A | 8/1997 | Bernhardt et al. | |
| 5,973,015 A | 10/1999 | Coronado et al. | |
| 6,087,407 A | 7/2000 | Coronado et al. | |
| 6,168,737 B1 | 1/2001 | Poco et al. | |
| 6,270,846 B1 | 8/2001 | Brinker et al. | |
| 6,599,953 B1 | 7/2003 | Ratke et al. | |
| 6,679,471 B2 | 1/2004 | Domeier et al. | |
| 6,887,915 B2 | 5/2005 | Ratke et al. | |
| 7,226,146 B2 * | 6/2007 | Chen et al. ...................... 347/54 |
| 2002/0160153 A1 | 10/2002 | Minami et al. | |
| 2003/0025225 A1 | 2/2003 | Shimmo et al. | |
| 2003/0060519 A1 | 3/2003 | Poco et al. | |
| 2003/0212152 A1 | 11/2003 | Ratke et al. | |
| 2005/0082700 A1 | 4/2005 | Deeman et al. | |
| 2007/0009968 A1 | 1/2007 | Cunningham et al. | |
| 2008/0011934 A1 | 1/2008 | Verschuuren et al. | |
| 2009/0184088 A1 | 7/2009 | Carlson | |
| 2010/0165442 A1 | 7/2010 | Tung et al. | |

FOREIGN PATENT DOCUMENTS

EP    2 082 990 A2 *    7/2009
JP    2008006639    1/2008

OTHER PUBLICATIONS

Shih-Kang Fan et al., "MEMS With Thin-Film Aerogel", "The 14th IEEE International Conference on Micro Electro Mechanical Systems, 2001", Jan. 21-25, 2001, pp. 122-125, Publisher: IEEE, Published in: Interlaken, Switzerland.

Bertino et al., "High resolution patterning of silica aerogels", "Journal of Non-Crystalline Solids", May 8, 2003, pp. 108-110.

(Continued)

*Primary Examiner* — Scott B Geyer
(74) *Attorney, Agent, or Firm* — Fogg & Powers LLC

(57) ABSTRACT

Systems and methods for processing sacrificial layers in MEMS device fabrication are provided. In one embodiment, a method comprises: applying a patterned layer of Aerogel material onto a substrate to form an Aerogel sacrificial layer; applying at least one non-sacrificial silicon layer over the Aerogel sacrificial layer, wherein the non-sacrificial silicon layer is coupled to the substrate through one or more gaps provided in the patterned layer of Aerogel material; and removing the Aerogel sacrificial layer by exposing the Aerogel sacrificial layer to a removal liquid.

17 Claims, 2 Drawing Sheets

OTHER PUBLICATIONS

Figure 1:
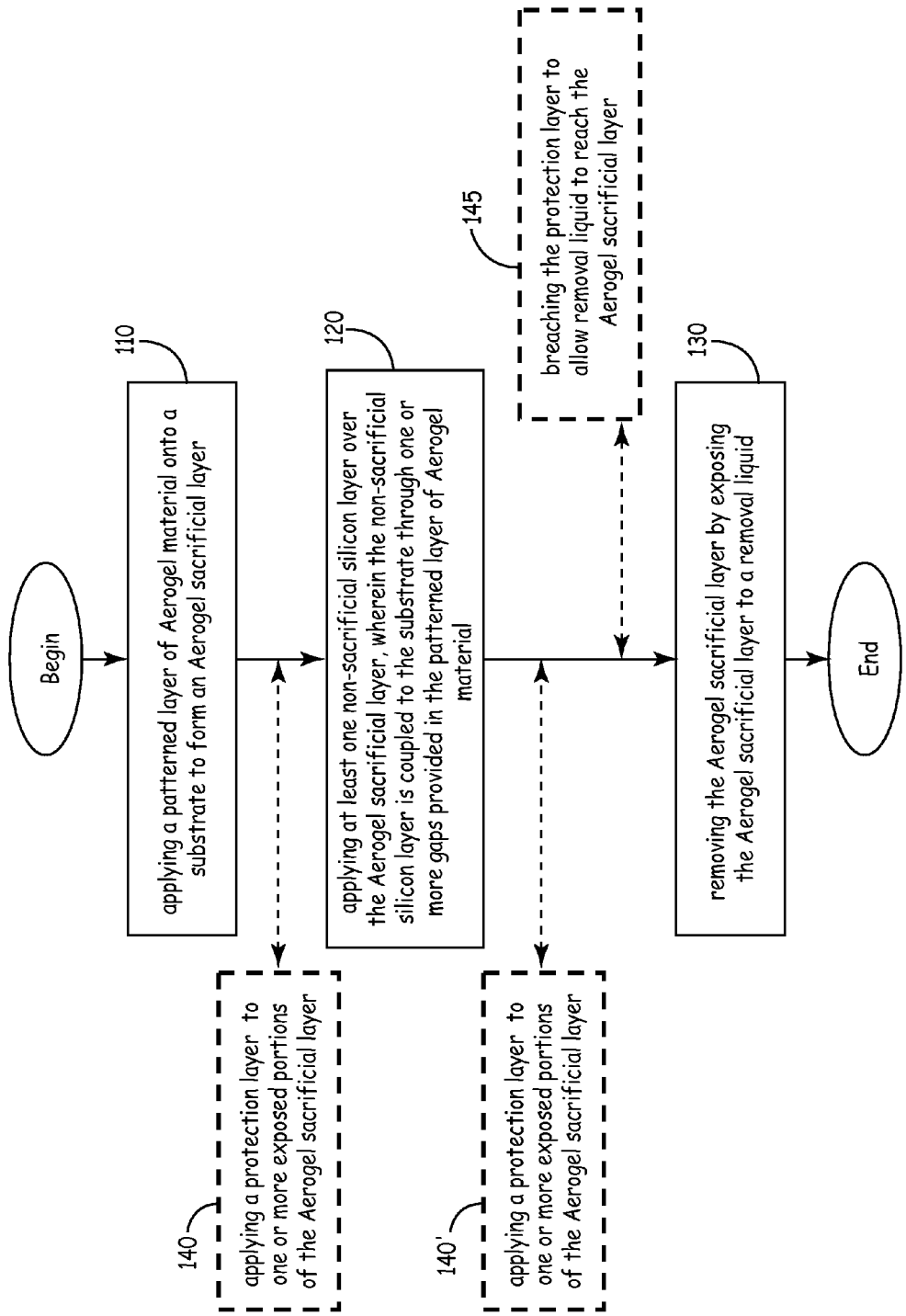

Blaschta et al., "SiO2 Aerogel ultra low k dielectric patterning using different hard mask concepts and stripping processes", Aug. 4, 2004, pp. 8-15, vol. 76, Publisher: Microelectronic Engineering.

Hrubesh, "Thin Aerogel Films for Optical, Thermal, Acoustic and Electronic Applications", "Journal of Non-Crystalline Solids", Sep. 30, 1994, pp. 46-53, vol. 188, Publisher: Elsevier Science.

Jo, "SiO2 Aerogel Film As a Novel Intermetal Dielectric", Aug. 1, 1997, pp. 1299-1304, vol. 82, No. 3, Publisher: J. Appln. Phys.

Kim, Gun S. and Sang H. Hyun, "Synthesis and Characterization of Silica Aerogel Films for Inter-Megal Dielectrics via Ambient Drying", "Thin Solid Films", Apr. 12, 2004, pp. 190-200, vol. 460, Publisher: Elsevier B.V.

Kistler, "Coherent Expanded Aerogels and Jellies", "Nature", May 16, 1931, pp. 741 vol. 127, No. 3211, Publisher: Nature Publishing Group.

Krug, "Fine Patterning of Thin Sol-Gel Films", "Journal of Non-Crystalline Solids", Oct. 1991, Publisher: Advanced Materials from Gels, Proceedings of the Sixth International Workshop on Glasses and Ceramics from Gels Oct. 6-11, 1991.

Mayer, "Tem Sample Preparation and FIB-Induced Damage", "MRS Bulletin", May 2007, pp. 400-407, vol. 32.

Moberlychan, "Fundamentals of Focused Ion Beam Nanostructural Processing: Below, at, and Above the Surface", "MRS Bulletin", May 2007, pp. 424-432, vol. 32.

Norris, Pamela M. and Sushil Shrinivasan, "Aerogels: Unique Material, Fascinating Properties and Unlimited Applications", "Annual Review of Heat Transfer", Jan. 2005, pp. 385-408, vol. 14, Publisher: Begell House, Inc.

Poco, "Synthesis of High Porosity, Monolithic Alumina Aerogels", Jun. 2001.

Prakash et al., "Silica Aerogel Films Prepared at Ambient Pressure by Using Surface Derivatization to Induce Reversible Drying Shrinkage", "Letters to Nature", Mar. 30, 1995, pp. 439-443, vol. 374, Publisher: Nature.

Richter et al., "Aerogels: Applications, Structure, and Heat Transfer Phenomena", "Annual Review of Heat Transfer Ch. 2", Jan. 1995, pp. 61-114, vol. 6, Publisher: Begell House, Inc.

Ryuji Yokokawa et al., "Mechanical properties of aerogel-like thin films used for MEMS.", Mar. 17, 2004, pp. 681-686, vol. 14, Publisher: Journal of Micromechanics and Microengineering.

Volkert, "Focused Ion Beam Microscopy and Micromachining", "MRS Bulletin", May 2007, pp. 389-399, vol. 32.

Yoldas, "Chemical Engineering of Aerogel Morphology Formed Under Nonsupercritical Conditions for Thermal Insulation", "Chem. Mater", Jun. 12, 2000, pp. 2475-2484, vol. 12, No. 8, Publisher: American Chemical Society.

U.S. Patent and Trademark Office, "Advisory Action", " U.S. Appl. No. 12/017,944 ", Sep. 29, 2001.

U.S. Patent and Trademark Office, "Final Office Action", "U.S. Appl. No. 12/017,944 ", Jul. 21, 2011.

U.S. Patent and Trademark Office, "Office Action", "U.S. Appl. No. 12/017,944 ", Mar. 18, 2011.

U.S. Patent and Trademark Office, "Office Action", "U.S. Appl. No. 12/017,944 ", Apr. 12, 2012.

Patel et al., "An Overview of Silica Aerogels", "International Journal of ChemTech Research", Oct. 2009, pp. 1052-1057, vol. 1, No. 4.

U.S. Patent and Trademark Office, "Restriction Requirement", "U.S. Appl. No. 12/017,944 ", Dec. 30, 2010.

* cited by examiner

SACRIFICIAL LAYERS MADE FROM AEROGEL FOR MICROELECTROMECHANICAL SYSTEMS (MEMS) DEVICE FABRICATION PROCESSES

BACKGROUND

When designing microelectromechanical systems (MEMS) based devices it is often desirable to have open areas or voids in the structure. Such open areas can be used for thermal isolation, such as making a diaphragm, or for mechanical purposes, such as allowing moving parts. In the current state of the art, such open areas or voids are formed by including solid sacrificial layers within the structure. Once the desired structure is built, the sacrificial layers are chemically dissolved, and the dissolved material is removed to form the open area.

Dissolving starts at the perimeter of the sacrificial layer which is covered by a non-sacrificial layer and works its way in towards the center of the structure. As the sacrificial layer dissolves, the waste products must be removed and fresh etchant must be presented to complete the dissolving processed. A problem however occurs when the MEMS design calls for a very small gap that extends for a relatively long distance (for example, a gap 0.1 micron tall and 200-2000 micron from edge to center). With such an aspect ratio, it becomes difficult to get fresh etchant further into the emerging gap to the sacrificial layer material. At the same time it gets more difficult to get the waste products out. At least in some applications, remaining waste products within the gap can interfere with moving parts. The use of pinholes in non-sacrificial layers that let etchant in and out from the top of the sacrificial layer has been proposed. However, such a solution is also problematic where the function of the gap is to provide a conduit for liquid or gas samples for analysis. Such pinholes would allow outside contaminants to affect the samples, or allow the samples to escape. Similarly, if the gap houses a resonating structure and needs to hold a vacuum, such pinhole can allow outside gasses to enter the gap which will affect the resonating qualities of the structure.

For the reasons stated above and for other reasons stated below which will become apparent to those skilled in the art upon reading and understanding the specification, there is a need in the art for improved systems and methods for MEMS device fabrication.

SUMMARY

The Embodiments of the present invention provide methods and systems for MEMS device fabrication and will be understood by reading and studying the following specification.

In one embodiment, a method for processing sacrificial layers in MEMS device fabrication comprises: applying a patterned layer of Aerogel material onto a substrate to form an Aerogel sacrificial layer; applying at least one non-sacrificial silicon layer over the Aerogel sacrificial layer, wherein the non-sacrificial silicon layer is coupled to the substrate through one or more gaps provided in the patterned layer of Aerogel material; and removing the Aerogel sacrificial layer by exposing the Aerogel sacrificial layer to a removal liquid.

DRAWINGS

Figure 2A:
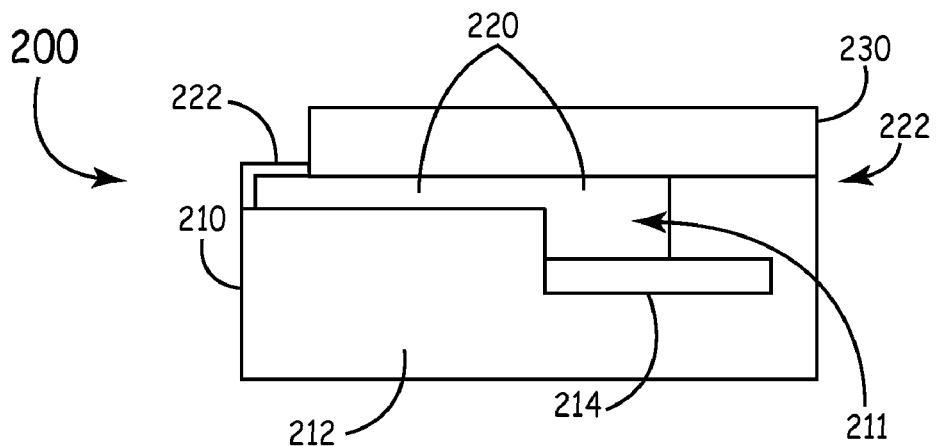
Figure 2B:
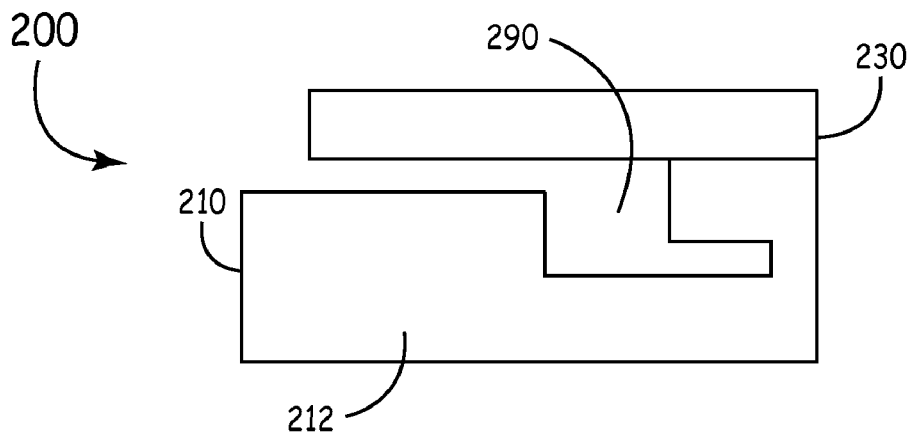

Embodiments of the present invention can be more easily understood and further advantages and uses thereof more readily apparent, when considered in view of the description of the preferred embodiments and the following figures in which:

FIG. 1 is a flow chart illustrating a method of one embodiment of the present invention; and FIGS. 2A and 2B are diagrams illustrating fabrication of a MEMS device of one embodiment of the present invention.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention utilize Aerogel for forming sacrificial layers during MEMS fabrication processes in order to provide for open spaces or voids in a finished MEMS device. Aerogel, once applied and cured, forms a low density yet structurally strong foundation layer that can physically support subsequent layers during MEMS fabrication, but can be readily removed. Because of its low density characteristics, an Aerogel sacrificial layer contains only a fraction of the mass of a solid sacrificial layer, allowing a relatively much larger volume of Aerogel to be etched before exhausting the etchant or having problems removing waste byproducts. The low mass of the Aerogel sacrificial layer is achieved because the silica material forming the sacrificial layer cures into a web of oxide filaments forming a porous, sponge-like structure that, per unit volume, is comprised mostly of voids. Having this porous structure for the Aerogel sacrificial layer has two benefits. First, it facilitates a capillary action that pulls the dissolving etchant in and quickly distributes fresh etchant through the layer. Second, when exposed to liquids the porous Aerogel material tends to shrivel and collapse due to surface tension of liquids, also clearing the way for fresh etchant to wick much farther into the sacrificial layer before actually etching the shriveled Aerogel. Further details regarding Aerogel material can be found in U.S. Patent Publication 2009/0184088, published Jul. 23, 2009, which is herein incorporated by reference.

For some MEMS applications, just collapsing the Aerogel layer alone may be sufficient to open the sacrificial area enough to create the intended void within the MEMS device. Utilizing the surface tension/collapsing effect, described in greater detail below, allows a wider range of liquids to be used to remove the Aerogel sacrificial layer as they can be selected for qualities that are less likely to affect non-sacrificial structures. Further, using inert chemicals to remove an Aerogel sacrificial layer (as opposed to strong acid etchant), in turn, allows for the MEMS designer to choose from a wider range of materials for fabricating portions of the MEMS device which are not supposed to be attacked during the removal of the sacrificial layer.

FIG. 1 is a flow chart illustrating a method for fabricating a MEMS device of one embodiment of the present invention. In describing the method of FIG. 1, reference is made to a MEMS device 200 illustrated in FIGS. 2A and 2B. It would be understood by one of ordinary skill in the art upon reading this specification that MEMS device 200 is intended to generically represent MEMS devices rather than any specific MEMS device or class of MEMS devices. That is, the method shown in FIG. 1 is intended to cover in scope embodiments for fabricating any MEMS device designs calling for open areas (i.e. voids) within the structure of the device. Further, one of ordinary skill in the art upon studying this specification would appreciate that the individual steps described in FIG. 1 can each be achieved using MEMS fabrication techniques known to those of ordinary skill in the art. For this reason, details of such MEMS fabrication techniques are not further described herein.

The method begins at 110 with applying a patterned layer of Aerogel material onto a substrate to form an Aerogel sacrificial layer. As shown in FIG. 2, a sacrificial layer 220 of Aerogel material is applied onto a substrate 210 at one of more locations where a void is called for per the MEMS device 200 design. In some embodiments, rather than having a smooth flat upper surface, the substrate 210 may include indented regions 211 which are at least partially filled when the pattered layer of Aerogel material is applied. In one embodiment the substrate 210 is a silicon or other material that forms a non-sacrificial layer of the MEMS device 200. In other embodiments, the substrate 210 itself may comprise a combination of non-sacrificial material 212 and a previously applied sacrificial layer 214 of Aerogel material. Sacrificial layer 220 provides a structural foundation for building additional structures onto substrate 210. The density and pore size for the Aerogel material can be separately controlled by one of ordinary skill in the art upon reading this specification using known processes and standards for spin coating Aerogel layers.

The method proceeds at 120 with applying at least one non-sacrificial Silicon layer 230 over the Aerogel sacrificial layer 220. The sacrificial layer 220 was patterned so that the subsequently applied non-sacrificial silicon layers 230 will contact with, and thus remain secured to, substrate 210 once sacrificial layer 220 is removed. That is, if sacrificial layer 220 were applied as a continuous film over substrate 210, then when sacrificial layer 220 is removed non-sacrificial silicon layers 230 and any structures above it would simply lift off. Thus one or more gaps in the patterned layer of Aerogel material laid over substrate 210 are provided for attaching the subsequently applied non-sacrificial silicon layers 230 to substrate 210 (shown generally at 222).

Because the Aerogel sacrificial layer 220 is vulnerable to liquids, it needs be protected during the fabrication of MEMS device 200 from unintended contact with liquids. These edges of the patterned Aerogel film should be protected during subsequent processing from liquids so that Aerogel sacrificial layer 220 is not prematurely removed or otherwise damaged. Accordingly, in one embodiment, the method optionally provides for applying a protection layer 222 to one or more exposed portions 224 of the Aerogel sacrificial layer 220 (shown in blocks 140 and 140'). Protection layer 222 may be applied prior to applying non-sacrificial silicon layer 230 over the Aerogel sacrificial layer 220 (indicated by block 140), or after (indicated by block 140'), based on when the presence of such liquids is expected during fabrication. For fabrication processes where liquids will not be present prior to removal of Aerogel sacrificial layer 220, application of protection layer 222 may not be necessary, and for that reason is optional.

The method proceeds at 150 with removing the Aerogel sacrificial layer 220 by exposing the Aerogel sacrificial layer 220 to a removal liquid. For embodiments where a protection layer 222 was applied, removing the Aerogel sacrificial layer 220 will include the additional step of breaching the protection layer 222 in the desired places to allow the removal liquid to reach Aerogel sacrificial layer 220 (indicated by block 145). FIG. 2B provides a diagram of MEMS device 220 with sacrificial layers 220 and 214 removed to open up void 290.

In one embodiment, the Aerogel sacrificial layer 220 is removed by introducing a chemical etchant that dissolves the Aerogel material. Using a chemical etchant is appropriate for embodiments where Aerogel sacrificial layer 220 needs to be dissolved and the waste products removed (to prevent potential interference with moving parts, for example). Examples of appropriate chemical etchants include, but are not limited to hydrofluoric acid, phosphoric acid or organic solvents. Because of the low density and porous structure of the Aerogel material, there is less physical mass to dissolve meaning that relatively less chemical etchant is necessary per unit volume. Further, because there is relatively less waste material produced, there is less waste material to inhibit flow of fresh etchant into the void and less waste material that needs to be removed. Since only the solid part of the Aerogel must be dissolved, the sacrificial etch will be faster, limiting any small but finite etching of the non-sacrificial materials.

In another embodiment, the Aerogel sacrificial layer 220 is removed by introducing an inert chemical that collapses the Aerogel material. Using an inert chemical is appropriate for embodiments where having a small amount of waste material remaining in the void is acceptable and will not interfere with other structures (for example, where the void created by removing the Aerogel sacrificial layer 220 will be used as a fluid conduit). The inert chemical will not appreciably dissolve the Aerogel material. However, the surface tension of the liquid will cause the Aerogel material to collapse, thus opening a void within MEMS device 200 where the Aerogel sacrificial layer 220 previously existed. Examples of appropriate inert chemicals include, but are not limited to, alcohols, acetone, or water. Whether a chemical is considered inert with respect to the remaining structures of the MEMS device 200 can be readily determined by one of ordinary skill in the art upon reading this specification based on the chemical properties of said remaining structures.

Generally, once the Aerogel sacrificial layer 220 has been removed to open up the desired voids in MEMS device 200, further process should be avoided so as not to damage moving parts within the voids or introduce foreign material contaminants.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for processing sacrificial layers in MEMS device fabrication, the method comprising:

applying a patterned layer of Aerogel material onto a substrate to form an Aerogel sacrificial layer;

applying at least one non-sacrificial silicon layer over the Aerogel sacrificial layer, wherein the non-sacrificial silicon layer is coupled to the substrate through one or more gaps provided in the patterned layer of Aerogel material; and removing the Aerogel sacrificial layer by exposing the Aerogel sacrificial layer to a removal liquid;

applying a protection layer to one or more exposed regions of the Aerogel sacrificial layer.

2. The method of claim 1, wherein the substrate includes indented regions that are layered with the Aerogel material when the patterned layer of Aerogel material is applied.

3. The method of claim 1, wherein the substrate comprise a combination of non-sacrificial material and a previously applied sacrificial layer of Aerogel material.

4. The method of claim 1, wherein the protection layer is applied prior to applying the at least one non-sacrificial silicon layer over the Aerogel sacrificial layer.

5. The method of claim 1, wherein the protection layer is applied after applying the at least one non-sacrificial silicon layer over the Aerogel sacrificial layer.

6. The method of claim 1, wherein removing the Aerogel sacrificial layer further comprises breaching the protection layer to allow the removal liquid to reach the Aerogel sacrificial layer.

7. The method of claim 1, wherein removing the Aerogel sacrificial layer by exposing the Aerogel sacrificial layer to a removal liquid further comprises:
   exposing the Aerogel sacrificial layer to a chemical etchant that dissolves the Aerogel material.

8. The method of claim 7, wherein the chemical etchant comprises one of a Hydrofluoric acid, a phosphoric acid or an organic solvent.

9. The method of claim 7, further comprising removing dissolved waste products.

10. The method of claim 1, wherein removing the Aerogel sacrificial layer by exposing the Aerogel sacrificial layer to a removal liquid further comprises:
    exposing the Aerogel sacrificial layer to an inert chemical that collapses the Aerogel material.

11. The method of claim 10, wherein the inert chemical comprises at least one of an alcohol, an acetone, or water.

12. A method for fabrication MEMS devices with at least one open void defined within, the method comprising:
    fabricating a structure for a MEMS device having a plurality of non-sacrificial material layers and at least one Aerogel sacrificial layer made from an Aerogel material, wherein the at least one Aerogel sacrificial layer made from an Aerogel material occupies a volume within the structure defining where a void is to be located within the MEMS device;
    removing the Aerogel sacrificial layer by exposing the Aerogel material to a removal liquid;
    wherein fabricating the structure for the MEMS device further comprises:
    applying a patterned layer of Aerogel material onto a substrate to form the Aerogel sacrificial layer;
    applying at least one non-sacrificial silicon layer over the Aerogel sacrificial layer;
    wherein the non-sacrificial silicon layer is coupled to the substrate through one or more gaps provided in the patterned layer of Aerogel material; and
    applying a protection layer to one or more exposed regions of the Aerogel sacrificial layer.

13. The method of claim 12, wherein the substrate includes indented regions that are layered with the Aerogel material when the patterned layer of Aerogel material is applied.

14. The method of claim 12, wherein the substrate comprise a combination of non-sacrificial material and a previously applied sacrificial layer of Aerogel material.

15. The method of claim 12, wherein removing the Aerogel sacrificial layer by exposing the Aerogel material to a removal liquid further comprises one of:
    exposing the Aerogel sacrificial layer to a chemical etchant that dissolves the Aerogel material; or
    exposing the Aerogel sacrificial layer to an inert chemical that collapses the Aerogel material.

16. The method of claim 15, wherein the chemical etchant comprises one of a Hydrofluoric acid, a phosphoric acid or an organic solvent.

17. The method of claim 15, wherein the inert chemical comprises at least one of an alcohol, an acetone, or water.

\* \* \* \* \*